(12) United States Patent
Baehr-Jones et al.

(10) Patent No.: US 11,070,033 B2
(45) Date of Patent: Jul. 20, 2021

(54) OPTICAL AMPLIFIER

(71) Applicant: Elenion Technologies, LLC, New York, NY (US)

(72) Inventors: Thomas Wetteland Baehr-Jones, Arcadia, CA (US); Saeed Fathololoumi, San Gabriel, CA (US); Yangjin Ma, Brooklyn, NY (US)

(73) Assignee: Nokia Solutions & Networks Oy, Espoo (FI)

( * ) Notice: Subject to any disclaimer, the term of this patent is extended or adjusted under 35 U.S.C. 154(b) by 192 days.

(21) Appl. No.: 16/289,133

(22) Filed: Feb. 28, 2019

(65) Prior Publication Data
US 2019/0267779 A1    Aug. 29, 2019

Related U.S. Application Data

(63) Continuation-in-part of application No. 15/903,835, filed on Feb. 23, 2018, now abandoned.

(51) Int. Cl.
| | |
|---|---|
| *H01S 5/50* | (2006.01) |
| *H01S 5/12* | (2021.01) |
| *H01S 5/10* | (2021.01) |
| *H01S 3/23* | (2006.01) |
| *H01S 5/11* | (2021.01) |

(52) U.S. Cl.
CPC ......... *H01S 5/5045* (2013.01); *H01S 5/1028* (2013.01); *H01S 5/11* (2021.01); *H01S 5/1246* (2013.01); *H01S 3/2308* (2013.01)

(58) Field of Classification Search
None
See application file for complete search history.

(56) References Cited

U.S. PATENT DOCUMENTS

| | | | | |
|---|---|---|---|---|
| 4,111,521 | A | * | 9/1978 | Streifer .............. G02B 6/12004 372/50.1 |
| 4,943,782 | A | * | 7/1990 | Stephens ................. H01S 3/005 359/338 |
| 5,657,148 | A | * | 8/1997 | Feuer .................... H01S 5/0265 359/263 |
| 6,574,259 | B1 | * | 6/2003 | Fish ...................... H01S 5/0262 372/50.1 |

(Continued)

*Primary Examiner* — Eric L Bolda
(74) *Attorney, Agent, or Firm* — Stratford Managers Corporation

(57) ABSTRACT

Conventional integrated optical amplifiers, which combine different types of platforms, e.g. silicon photonic integrated circuit for the device layer, and a Group III-V material for the gain medium, typically include a curved waveguide extending through the gain medium coupled to waveguides in the main device layer. Unfortunately, the radius of curvature of the curved waveguide becomes a limiting factor for both size and amplification. Accordingly, an optical amplifier which eliminates the need for the curved waveguide by including a coupler for splitting an input optical signal into two sub-beams, for passage through the gain medium, and a reflector, such as a U-turn, for reflecting or redirecting the two sub-beams back through the gain medium to the coupler for recombination, would be a welcome improvement. A phase tuner may also be provided to ensure coherence cancellation between the two sub-beams to maximize output and minimize back reflection without requiring an isolator.

20 Claims, 11 Drawing Sheets

(56) References Cited

U.S. PATENT DOCUMENTS

| | | | |
|---|---|---|---|
| 6,628,690 B1* | 9/2003 | Fish | H04B 10/2914 |
| | | | 372/50.1 |
| 6,658,035 B1* | 12/2003 | Mason | H01S 5/0262 |
| | | | 372/50.22 |
| 9,780,524 B1* | 10/2017 | Zheng | H01S 3/105 |
| 9,780,528 B1* | 10/2017 | Zheng | H01S 5/021 |
| 2002/0105991 A1* | 8/2002 | Coldren | H04B 10/2914 |
| | | | 372/50.1 |
| 2014/0153084 A1* | 6/2014 | Papadopoulos | H01S 3/06754 |
| | | | 359/341.1 |
| 2018/0143461 A1* | 5/2018 | Zheng | H01S 5/50 |
| 2019/0190224 A1* | 6/2019 | Lee | H01S 3/08059 |

* cited by examiner

US 11,070,033 B2

OPTICAL AMPLIFIER

CROSS-REFERENCE TO RELATED APPLICATIONS

This application is a continuation in part of U.S. patent application Ser. No. 15/903,835 filed Feb. 23, 2018.

TECHNICAL FIELD

The present invention relates to an optical amplifier, and in particular to an integrated optical amplifier utilizing a semiconductor optical amplifier (SOA).

BACKGROUND

Conventional hybrid integrated optical amplifiers, which combine one type of platform for the main device layer, e.g. silicon photonic integrated circuit, and a different type for the gain medium, e.g. Group III-V material, typically require a 180° curved waveguide in the gain medium, so that the input into and the output from the gain medium are provided at a single mating surface with the main device layer. Unfortunately, the radius of curvature of the curved waveguide must be kept relatively large to ensure proper confinement and controlled amplification. Isolators are often used to minimize light reflecting back into the light source; however, isolators are not easily integrated into photonic integrated circuits.

An object of the present invention is to overcome the shortcomings of the prior art by eliminating the need for the isolators by providing an optical amplifier including a coupler for splitting an input optical signal into two sub-beams, for passage through a gain medium, and a reflector for reflecting the two sub-beams back through the gain medium to the coupler. A phase tuner may also be provided to ensure coherence cancellation between the two sub-beams to maximize output and minimize back reflection without requiring an isolator.

SUMMARY OF THE INVENTION

Accordingly, the present invention relates to an optical amplifier device comprising:

an input port for launching an input optical signal;

a first coupler including an input optically coupled to the input port, first and second input/outputs, and an output, wherein the first coupler is capable of separating the input optical signal into first and second sub-beams, and outputting the first and second sub-beams via the first and second input/outputs, respectively;

a gain medium optically coupled to the first and second input/outputs, capable of amplifying the first and second sub-beams forming first and second amplified sub-beams;

a reflector for reflecting the first and second amplified sub-beams back to the first coupler;

an output port optically coupled to the output for outputting the amplified optical signal; and a first phase shifter capable of adjusting a phase of the first sub-beam and the first amplified sub-beam, so that the first amplified sub-beam combines coherently with the second amplified sub-beam causing coherent cancellation therebetween, and forming an combined amplified optical signal, whereby substantially all of the combined amplified optical signal exits the output of the first coupler;

wherein the first coupler is further capable of combining the first and second amplified sub-beams into the combined amplified optical signal, and outputting the combined amplified optical signal via the output to the output port.

Another aspect of the present invention relates to an optical amplifier device comprising:

a first input port for launching a first input optical signal;

a first coupler including first, second, third and fourth branches, the first branch optically coupled to the first input port, wherein the first coupler is capable of separating the first input optical signal into first and second sub-beams onto the second and third branches, respectively;

a gain medium optically coupled to the second and third branches, capable of amplifying the first and second sub-beams forming first and second amplified sub-beams;

a U-turn in the gain medium for redirecting the first sub-beam back through the gain medium to the second input/output and for redirecting the second sub-beam back through the gain medium to the first input/output;

a first output port optically coupled to the fourth branch for outputting a first amplified optical signal; and a first phase shifter capable of adjusting the phase of the first sub-beam and the first amplified sub-beam, so that the first amplified sub-beam combines coherently with the second amplified sub-beam causing coherent cancellation therebetween, whereby substantially all of the first amplified optical signal exits the fourth branch and the first output port;

wherein the first coupler is further capable of combining the first and second amplified sub-beams into the first amplified optical signal, and outputting the first amplified optical signal via the fourth branch to the first output port.

BRIEF DESCRIPTION OF THE DRAWINGS

The invention will be described in greater detail with reference to the accompanying drawings which represent preferred embodiments thereof, wherein.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Figure 1A:
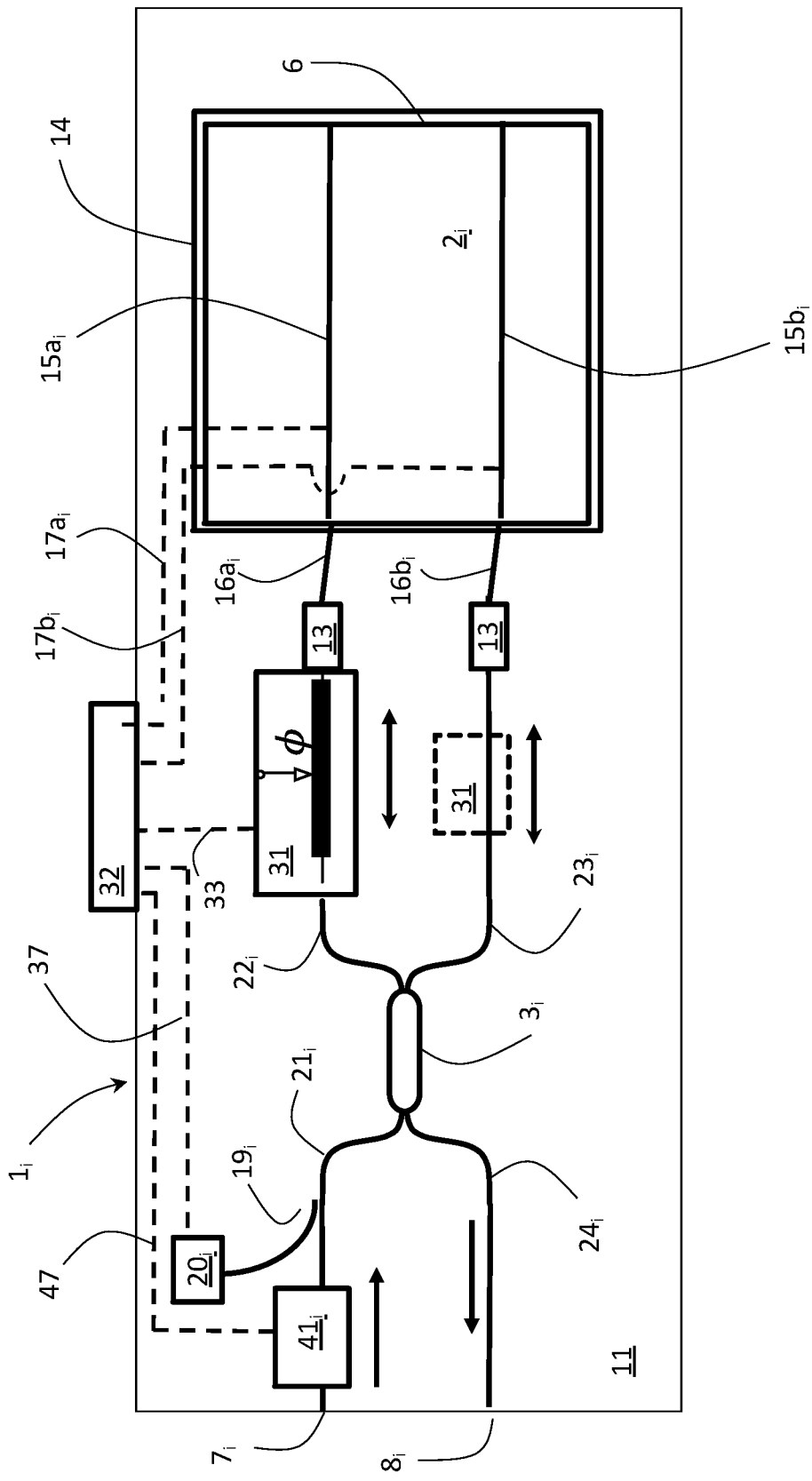
FIG. 1A is a schematic plan view of an optical amplifier in accordance with an embodiment of the present invention.
Figure 1B:
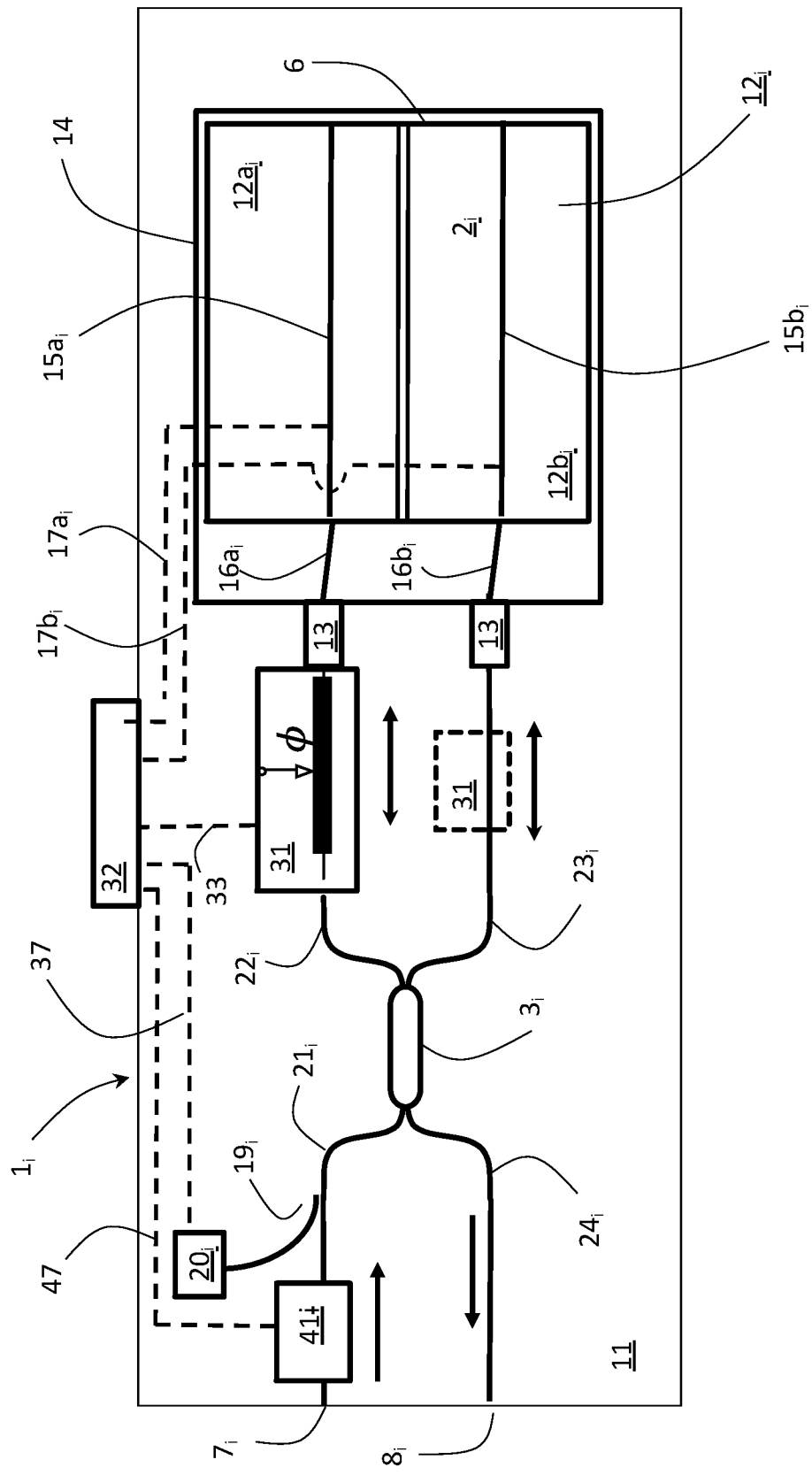
FIG. 1B is a schematic plan view of an optical amplifier in accordance with another embodiment of the present invention.
Figure 1C:
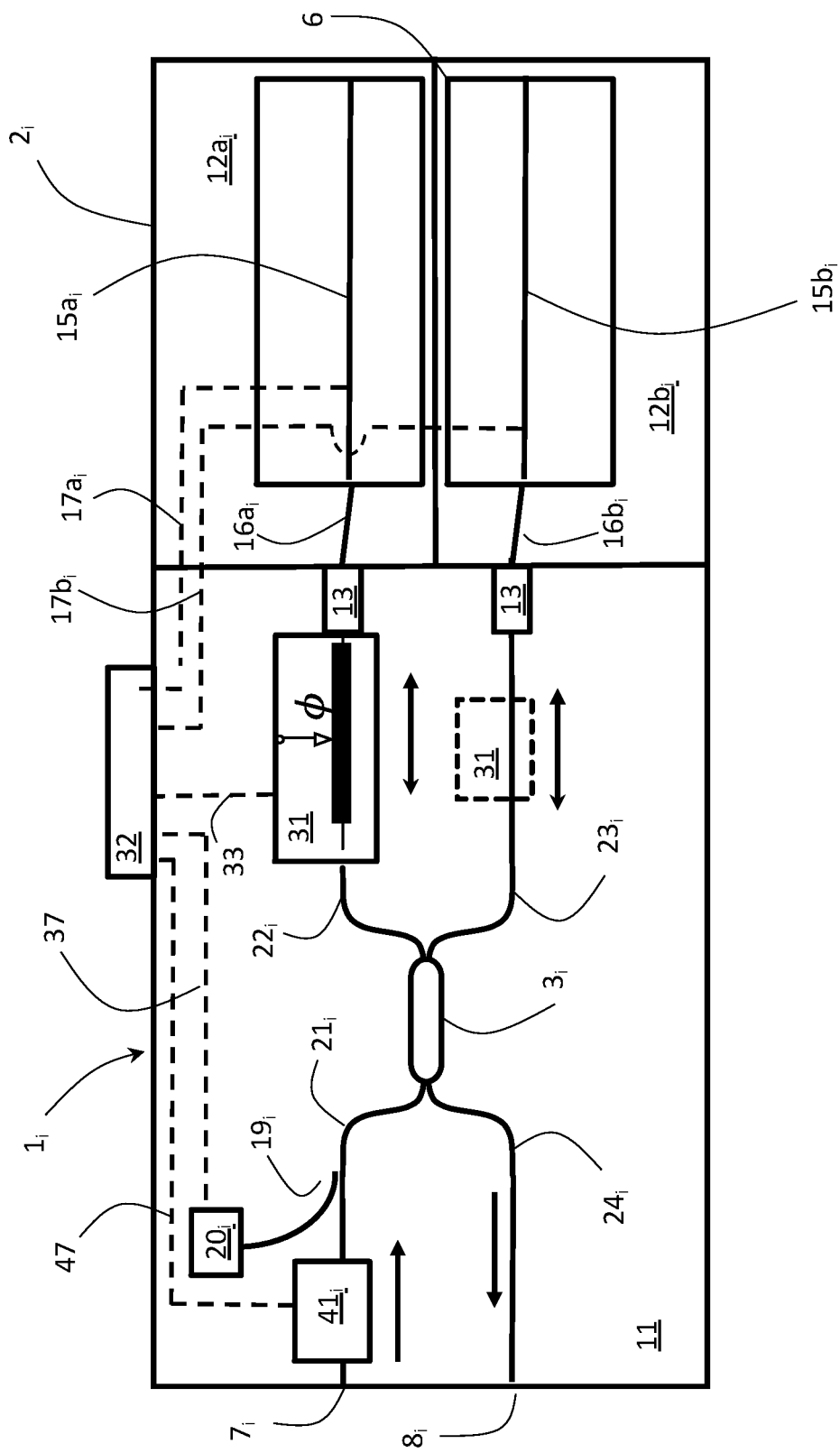
FIG. 1C a schematic plan view of an optical amplifier in accordance with another embodiment of the present invention.

With reference to FIGS. 1A to 1C, an amplifier device of an exemplary embodiment of the present invention includes one or more amplifiers $1_i$, each including a gain medium $2_i$, and a coupler $3_i$. (i being a natural number) A reflector 6, e.g. a reflective surface, is provided on or adjacent to the gain medium $2_i$ for reflecting light back to the coupler $3_i$. An input port $7_i$ and an output port $8_i$ are provided for receiving and transmitting light to and from the amplifier $1_i$ provided on a photonic integrated circuit (PIC) chip 11.

The gain medium $2_i$ may include any suitable amplification material, e.g. a suitable group III-V gain material, such as InP, GaAs and GaN based materials, in particular a reflective semiconductor optical amplifier (RSOA), which may be based on bulk, quantum well or quantum dot material. The gain medium $2_i$ may be provided on the photonic integrated circuit (PIC) chip 11, as illustrated in FIGS. 1A and 1B, with a single gain medium section $12_i$ including both waveguide channels $15a_i$ and $15b_i$ (FIG. 1A) or a pair of separate gain medium sections $12a_i$ and $12B_i$, each section including a respective one of the independently controllable waveguide channels $15a_i$ and $15b_i$ (FIG. 1B). The gain medium $2_i$ may be provided on one gain chip $12a$ with two independent sections, each section including a respective one of the independently controllable waveguide channels $15a_i$ and $15b_i$ (FIG. 1B) or two separate gain chips $12a_i$ and 12B, each chip $12a_i$ and $12B_i$ including a respective one of the independently controllable waveguide channels $15a_i$ and $15b_i$ with the remaining elements, i.e. the coupler $3_i$, provided on the photonic integrated circuit (PIC) chip 11, as illustrated in FIG. 1C. The gain medium chip or chips $12_i$ or $12a_i$ and $12B_i$ e.g. a RSOA, may also be placed, e.g. flip-chip bonded, onto the PIC chip 11, as illustrated in FIG. 1B, or the gain medium $2_i$ may be grown onto the PIC chip 11 in one $12_i$ or two independent $12a_i$ and $12B_i$ sections to form the amplifier $1_i$ defined in the device layer formed thereon, as illustrated in FIG. 1A.

The PIC chip 11 may include a separate substrate with a semiconductor, e.g. silicon, device layer formed thereon, which includes the coupler $3_1$ or the couplers $3_1$-$3_n$ and all connecting waveguides. Ideally the PIC chip 11 comprises a silicon on insulator (SOI) structure including an upper silicon device layer, a middle silicon dioxide cladding layer, and a bottom silicon substrate. The advantage of this arrangement is that electrical controls on the PIC chip 11 may control the properties of the amplifier 1, e.g. wavelength.

When the gain medium $2_i$ is embedded within the semiconductor PIC chip 11, as in FIGS. 1A and 1B, the connecting waveguides ($16a_i$ and $16b_i$) may be defined in either the PIC chip (e.g. SOI) material (See FIG. 1A) or the gain medium material (e.g. InP) (See FIG. 1B). During fabrication, a pit 14 may be etched from the device layer down to the substrate, followed by epitaxial growth of the gain medium $2_i$ (FIG. 1A) or placement of the gain medium chip(s) $12_i$ or $12a_i$ and $12B_i$ within the pit 14 (FIG. 1B). The cladding (oxide) layer may be removed from the PIC chip 11 in order to improve the thermal conductivity between the gain medium $2_i$ and the substrate, and to match the height of the gain medium $2_i$ with the semiconductor device layer. The gain medium $2_i$ or the gain medium chip(s) $12_i$ may be bonded to electrical contacts (metal or doped semiconductor), which are connected to metal terminals for connecting with external control and/or power, as hereinafter described.

Each optical coupler $3_i$ may include a first port or branch $21_i$ on one side optically coupled to the input port $7_i$, second and third ports or branches $22_i$ and $23_i$ on an opposite side optically coupled to the gain medium $2_i$, and a fourth port or branch $24_i$ on the one side optically coupled to the output port $8_i$. The first and fourth ports or branches 21 and 24 may be optically coupled to additional optical elements in the device layer of the PIC chip 11 and/or to an edge of the PIC chip 11. The terms optically coupled or coupled are intended to mean connected for the sake of transmitting light therebetween, typically directly connected or utilizing some form of waveguide structure, e.g. integrated waveguides in the device layer, with or without other intermediate optical elements therebetween. The optical coupler $3_i$, e.g. a 2×2 directional coupler (DC), may be connected to the gain medium $2_i$ in order to split an incoming beam of light into two sub-beams, one sub-beam including a first percentage, e.g. 40%-60%, ideally 50%, of the power directed to a first channel $15a_i$ of the gain medium $2_i$, and a second sub-beam including a second percentage, e.g. 40%-60%, ideally, 50% (or −3 dB) directed to the second channel $15b_i$ of the gain medium $2_i$. The coupling ratio may be optimized to trade for coupling losses in the device layer and amplification imbalances in the two waveguide channels $15a$ and $15b$.

One or more I/O waveguides $16a_i$ and $16b_i$, from the gain medium $2_i$ may be angled at a small acute angle to a normal from the output facet of the gain medium $2_i$, e.g. by 5° to 15°, ideally by 9°, and include an anti-reflection coating to reduce the back reflection at the output facet.

The reflector 6 may be comprised of a reflective surface on the RSOA, a reflective surface or coating in the pit housing the gain medium $2_i$, or on a surface or coating of the PIC chip 11 or the gain medium chip(s) $12_i$, such as an outer edge of the PIC chip 11, as illustrated in FIG. 1A. The reflector 6 may also comprise an alternate optical reflector, e.g. a grating, ring resonator, or some other wavelength filter element integrated into the PIC chip 11, the gain medium chip(s) $12_i$ or a separate reflector chip (not shown). Any combination of PIC chip 11, gain medium $2_i$/gain chip(s) $12_i$ arrangement, and reflective surface 6 arrangement is within the scope of the invention.

An optical coupler 13 may be provided for coupling the light between the gain medium $2_i$, in particular from the gain medium chip $12_i$, and the device layer on the PIC chip 11, in particular the coupler $3_i$. Due to the large mode mismatch between the I/O waveguides $16a_i$ and $16b_i$ (or the waveguide channels $15a_i$ and $15b_i$) from the gain medium $2_i$ and the waveguides in the device layer of the PIC chip 11, the optical coupler 13 may comprise an optical spot-size converter (SSC), which may be provided in the device layer of the PIC chip 11 to reduce the coupling loss between the gain medium $2_i$ and the PIC chip 11. Alternatively or in addition, the I/O waveguides $16a_i$ and $16b_i$ may include a tapering width and or height for expanding the mode reentering the gain medium $2_i$ and for contracting the mode leaving the gain medium chip(s) $12_i$.

One or more phase shifters or phase tuning sections 31 may be provided in or between the optical coupler $3_i$ and the gain medium $2_i$, coupled to one or both branches 22 and 23, as illustrated in FIGS. 1A and 1B. Each phase tuning section 31 may comprise any form of suitable phase tuning device, e.g. thermo-optic, electro-optic etc. The phase tuning section 31 may be controlled by an external controller 32, via control line 33, to control, e.g. the index of refraction or the effective optical length of the waveguide, i.e. the relative phase of the first and second sub-beams, whereby the first and second sub-beams are substantially correctly phased so that when the first and second amplified sub-beams return to the coupler $3_i$, the coupler $3_i$ combines the first and second amplified sub-beams coherently, so that coherent cancellation occurs, and substantially all of the combined amplified output beam is transmitted to the fourth port or branch $24_i$ and subsequently the output port $8_i$, and substantially none of the combined amplified output beam is transmitted back to the first port or branch 21 and subsequently to the input port $7_i$. The phase tuner, i.e. the phase tuning, may be provided by alternative means, e.g. in the coupler $3_i$ or in the gain medium $2_i$ or gain chip $12_i$.

To ensure the amplitude of each of the sub-beams is substantially the same or at a desired level relative to each other when combining in the coupler $3_i$ to minimize back reflection at the input port $7_i$, the controller 32 may also independently adjust or tune the drive current, i.e. the amplification, provided to each channel $15a_i$ and $15b_i$ of the gain medium $2_i$ via control lines $17a_i$ and $17b_i$, respectively. The tuning of the drive current may also act as or act in conjunction with the phase tuner 31.

Alternatively or in addition, a variable optical attenuator (VOA) may be positioned in or between the optical coupler $3_i$ and the gain medium $2_i$, coupled to one or both of the second and third ports or branches $22_i$ and $23_i$. Like the adjustment of the drive current, the VOA may be adjusted by the controller 32 via control lines to ensure the amplitude of each of the sub-beams is substantially the same or at a desired level relative to each other when combining in the first coupler $3_i$ to minimize back reflection at the input port $7_i$.

An optical sensor may be provided between the input port $7_i$ and the coupler $3_i$ for detecting an amount of back reflection from the gain medium $2_i$. The optical sensor may include a monitor tap 19, ideally in the form of a directional coupler, provided on the waveguide between the first port $21_i$ and the input port $7_i$ for separating off a small test portion, e.g. <5%, of the return light and delivering the test portion to a photodetector 20, to provide a measure of back reflection from the amplifier $1_i$. The controller 32 receives the measure of the back reflection via control line 37, and may tune the phase tuner 31 and/or the drive currents to the channels 15a and 15b and/or the VOA to minimize the back reflection at the input port $7_i$, and therefore maximize the output power in the amplified output beam at the output port $8_i$.

Figure 2A:
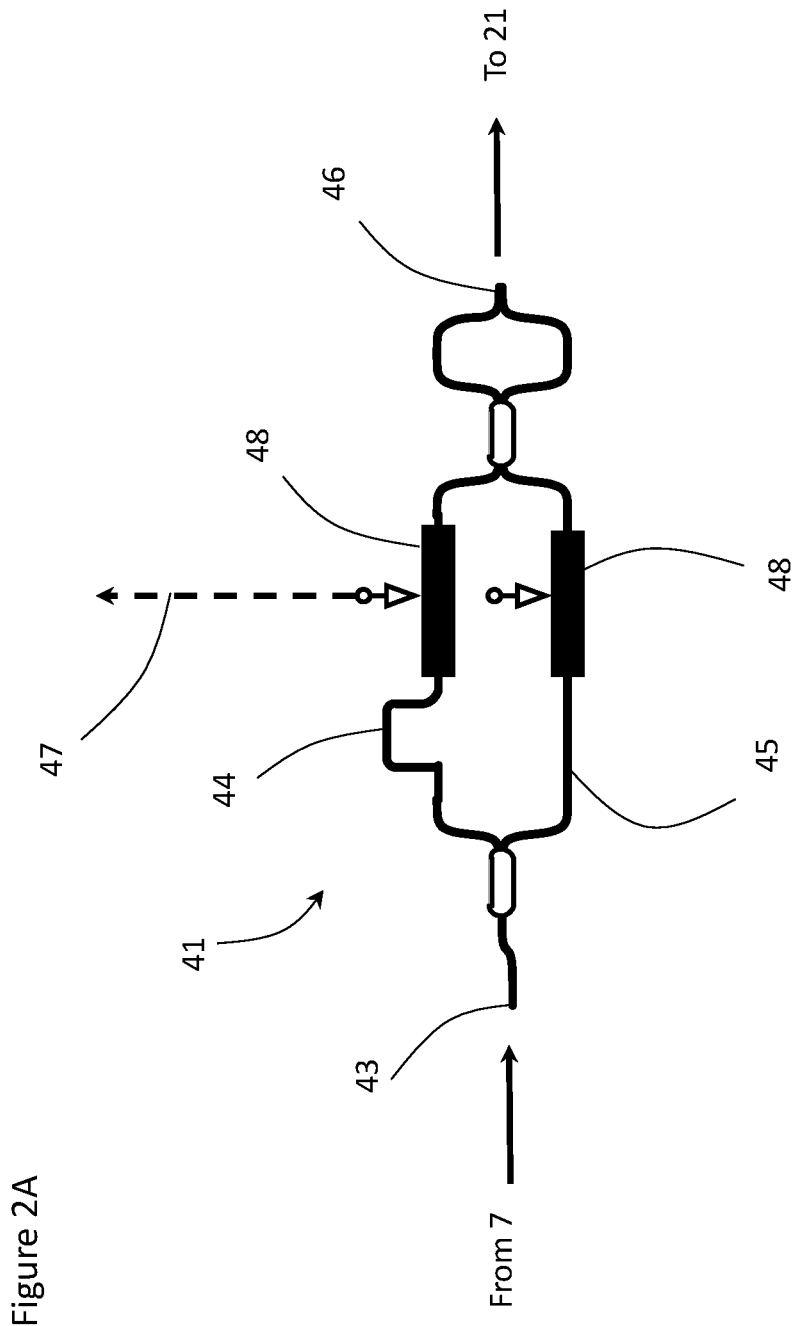
FIG. 2A a schematic plan view of an optical filter in accordance with an embodiment of any one of the optical amplifiers of FIGS. 1A to 1D.
Figure 2B:
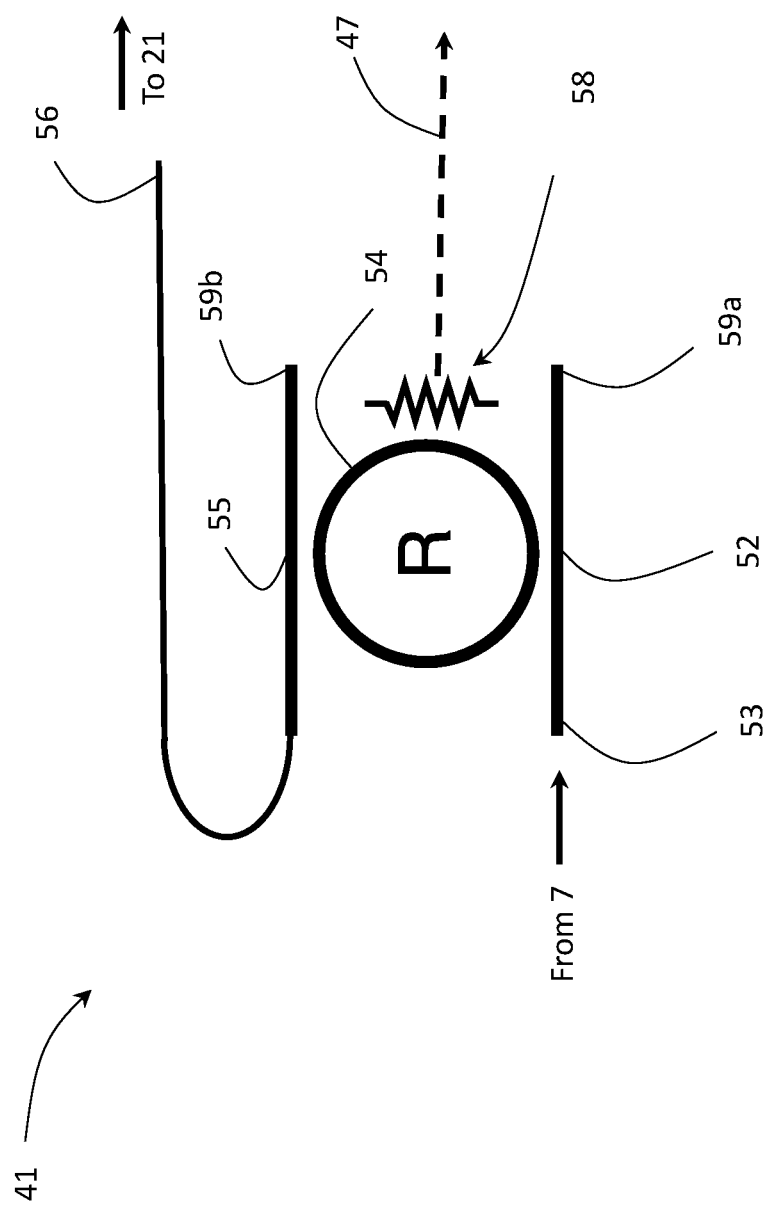
FIG. 2B a schematic plan view of an optical filter in accordance with an embodiment of any one of the optical amplifiers of FIGS. 1A to 1D.

An optical filter $41_i$ may be provided, ideally between the input port $7_i$ and the first port or branch $21_1$, for passing one or more selected optical wavelengths in the input optical signal and filtering out unwanted wavelengths, prior to amplification in the gain medium $2_i$. With reference to FIG. 2A, the optical filter $41_i$ may comprise an unbalance Mach Zehnder interferometer including an input 43 optically coupled to the input port $7_i$, first and second arms 44 and 45, and an output 46 optically coupled to the first port or branch $21_i$. Phase tuners 48, e.g. heaters, may be provided in one or both arms 44 and 45 for tuning the passband of the filter $41_i$, via control line 47. With reference to FIG. 2B, the optical filter 41 may comprise a ring resonator including an input waveguide 52 with an input port 53 optically coupled to the input port $7_i$, at least one ring 54, and an output waveguide 55 with an output port 56 optically coupled to the first port or branch $21_i$. Phase tuners 58, e.g. heaters, may be provided in one or both arms 44 and 45 for tuning the passband of the filter $41_i$, via control line 47. Additional monitor ports 59a and 59b may be available for monitoring light going into (59a) and going out of (59b) the filter $41_i$.

Figure 1D:
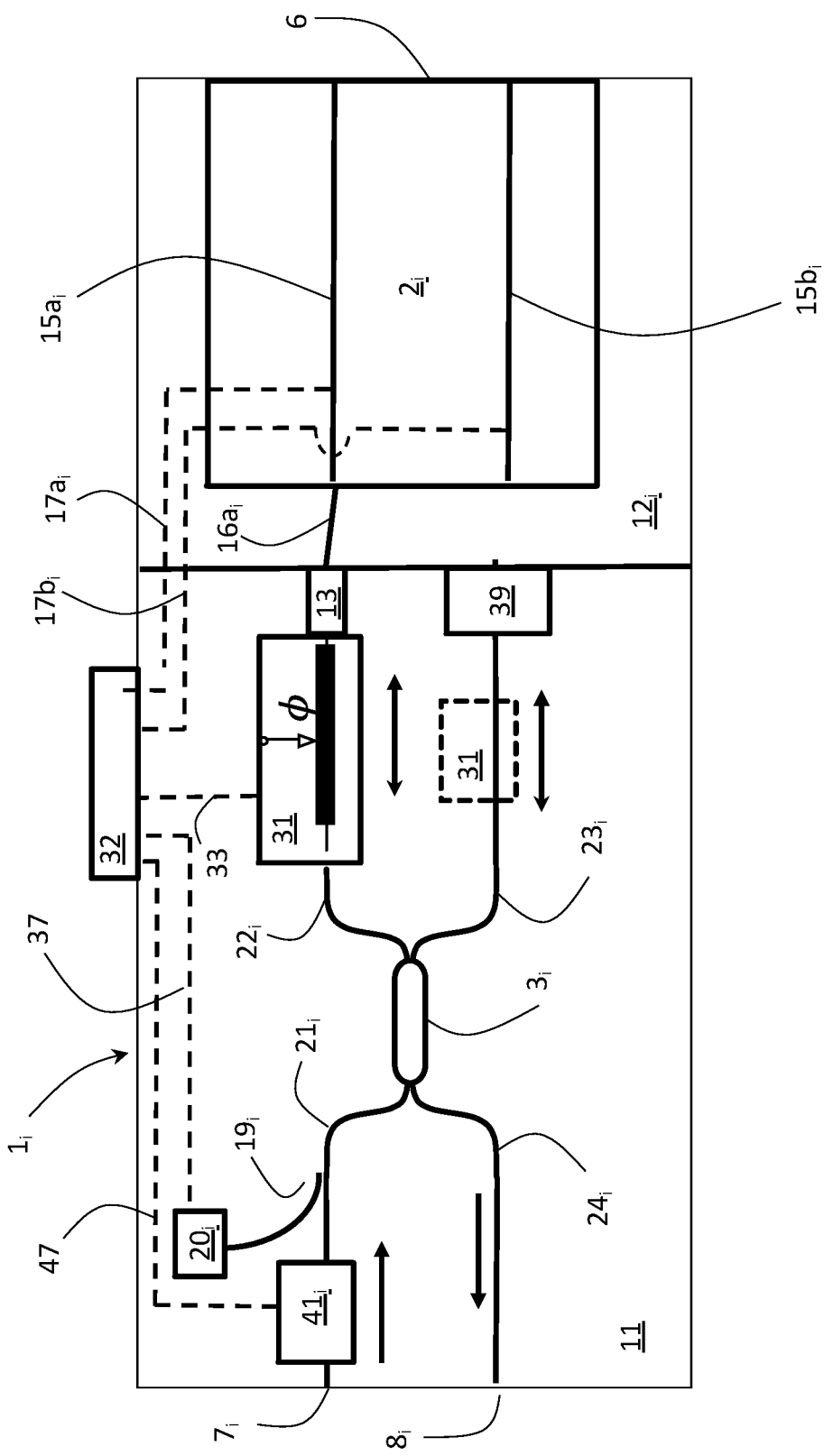
FIG. 1D a schematic plan view of an optical amplifier in accordance with another embodiment of the present invention.

With reference to FIG. 1D, an alternative embodiment for an amplifier $1_i$, may include all of the elements and possible variations of the previous embodiments, except the third port or branch $23_i$ is optically coupled with a beam dump 39 instead of the gain medium $2_i$. The beam dump 39 prevents the second sub-beam from returning to the coupler $3_i$, whereby the first sub-beam may be divided between the first and fourth ports 21 and 24, respectively.

Figure 3:
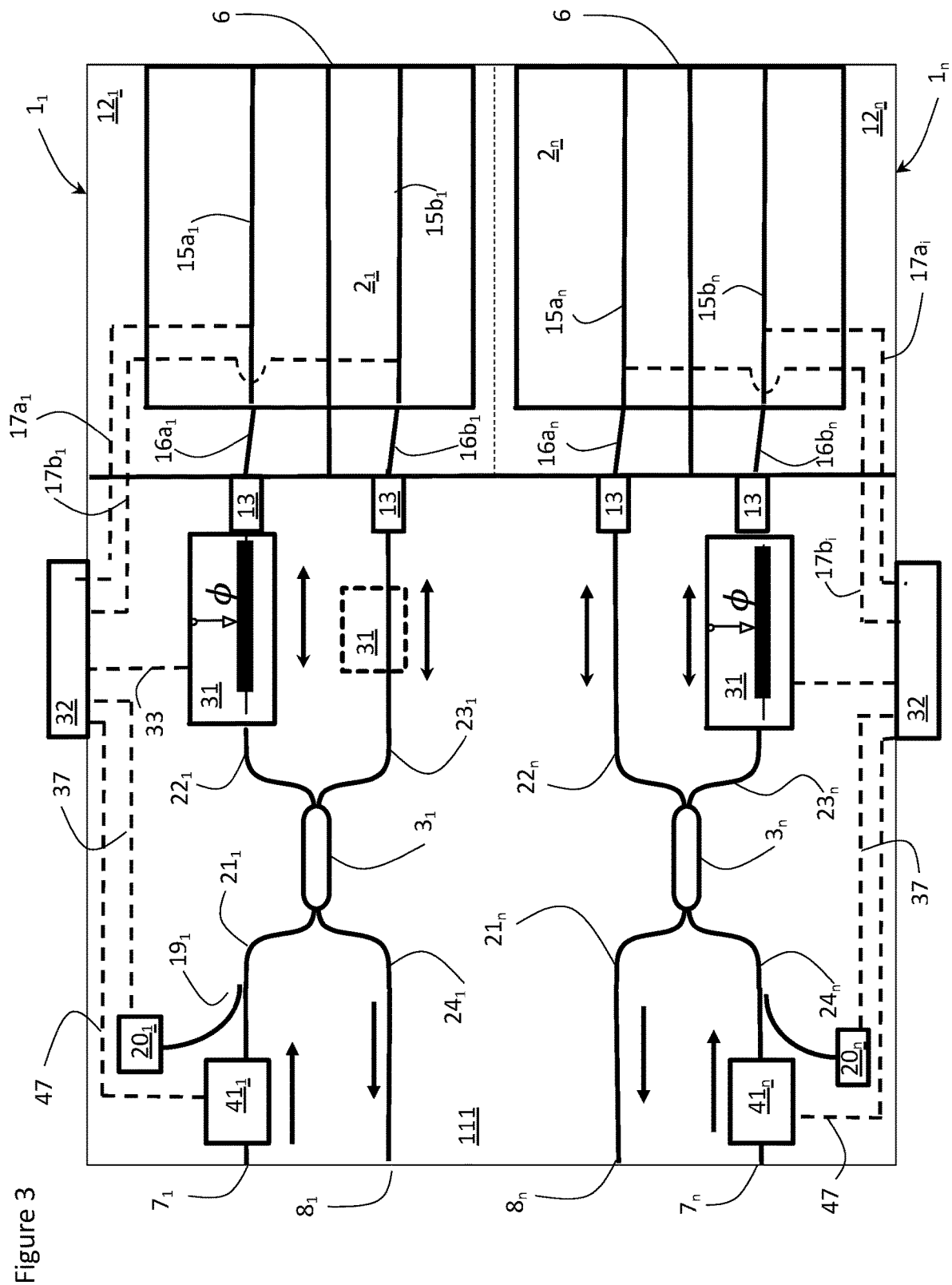
FIG. 3 schematic plan view of multi-optical amplifier assembly with multiple gain mediums in accordance with another embodiment of the present invention.

In another embodiment, illustrated in FIG. 3 an array of amplifiers $1_1$ to $1_n$ (n equal to a plurality, e.g. 2 or more) are provided on the same PIC chip 111, each amplifier $1_1$ to $1_n$ with a separate gain mediums $2_1$-$2_n$. An array of the elements, e.g. filters 41, phase tuning elements 31 and couplers $3_1$-$3_n$, may be provided on the single PIC chip 111, while a plurality of gain mediums $2_1$ to $2_n$ may be provided, as in hereinbefore described with reference to FIGS. 1A to 1C. For example, an array of separate gain mediums $2_1$-$2_n$, i.e. for amplifying a plurality of different wavelengths, may be provided on a plurality of different gain chips $12_1$-$12_n$, all of which are fixed to the single PIC chip 111. The gain mediums $2_1$-$2_n$ may be the same material capable of amplifying the different wavelengths or the gain mediums $2_1$-$2_n$ may be different materials capable of amplifying the different wavelengths.

Alternatively, a plurality of separate gain mediums $2_1$ to $2_n$ may be grown onto the single PIC chip 111 or a plurality of gain medium chips $12_1$ to $12_n$, e.g. a RSOA, may be placed, e.g. flip-chip bonded, onto the single PIC chip 111 to form the amplifiers $1_1$ to $1_n$ defined in the device layer formed thereon, as hereinbefore defined with reference to FIGS. 1A and 1B, respectively. The gain medium chips $11_1$ to $11_n$ may also be placed into separate pits 14 in the device layer for coupling with additional couplers $3_2$-$3_n$, as described herein. Accordingly, the gain mediums $2_1$ to $2_n$ are embedded within the semiconductor PIC chip 111, enabling the waveguides $16a_i$ to $16a_n$ and $16b_1$ to $16b_n$ to be defined in either the photonic chip (e.g. SOI) material or the gain medium material (e.g. InP). During fabrication, each pit 14 may be etched from the device layer down to the substrate, followed by epitaxial growth of the gain mediums $2_1$ to $2_n$ or placement of the gain medium chips $12_1$ to $12_n$ within the pits 14. The cladding (oxide) layer may be removed from the PIC chip 111 in order to improve the thermal conductivity between the gain mediums $2_1$ to $2_n$ and the substrate, and to match the height of the gain mediums $2_1$ to $2_n$ with the semiconductor device layer. The gain mediums $2_1$ to $2_n$ or the gain medium chips $12_1$ to $12_n$ may be bonded to electrical contacts (metal or doped semiconductor), e.g. control lines $17a_1$ to $17a_n$ and $17b_1$ to $17b_n$ which are connected to metal terminals for connecting with external control and/or power.

The PIC chip 111 may include a separate substrate with a semiconductor, e.g. silicon, device layer formed thereon, which includes the couplers $3_1$ to $3_n$ and all connecting waveguides. Ideally the PIC chip 111 comprises a silicon on insulator (SOI) structure including an upper silicon device layer, a middle silicon dioxide cladding layer, and a bottom silicon substrate. The advantage of this arrangement is that electrical controls on the PIC chip 111 may control the properties of the amplifiers $1_1$ to $1_n$, e.g. wavelength and gain.

Figure 4:
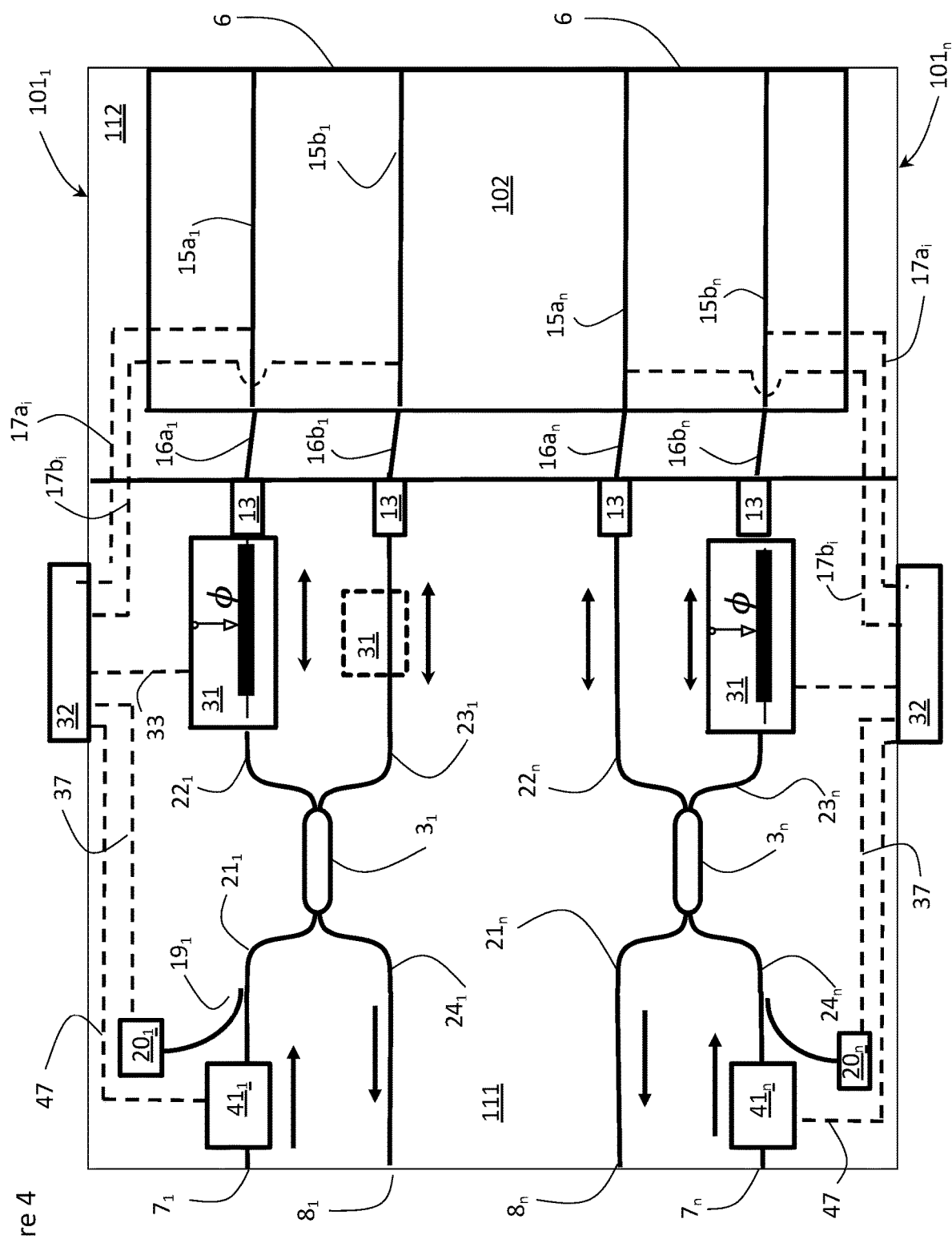
FIG. 4 schematic plan view of an multi-optical amplifier assembly with a single gain medium in accordance with another embodiment of the present invention.

In another embodiment, illustrated in FIG. 4 an array of amplifiers $101_1$ to $101_n$ (n equal to a plurality, e.g. 2 or more) are provided on the same PIC chip 111, each amplifier $101_1$ to $101_n$ with a same gain medium 102. An array of the elements, e.g. filters 41, phase tuning elements 31 and couplers $3_1$-$3_n$, may be provided on the single PIC chip 111, while the game medium 102 may be provided, as in hereinbefore described with reference to FIGS. 1A to 1C. For example, the gain mediums 102 may be provided on a different gain chip 112, which are fixed to the single PIC chip 111, as illustrated in FIG. 4. Each optical filter $41_1$ to $41_n$ may be tuned by the controllers 32 to pass a different wavelength channel, i.e. center wavelength, within the amplification range of the gain medium 102, for amplifying a plurality of different wavelengths channels at the same time.

Alternatively, the gain mediums 102 may be grown onto the single PIC chip 111 or a single gain medium chip 112, e.g. a RSOA, may be placed, e.g. flip-chip bonded, onto the single PIC chip 111 to form the amplifiers $101_1$ to $101_n$ defined in the device layer formed thereon, as hereinbefore defined with reference to FIGS. 1A and 1B, respectively. The gain medium chip 112 may also be placed into a pit 14 in the device layer for coupling with additional couplers $3_2$-$3_n$, as described herein. Accordingly, the gain medium 102 is embedded within the semiconductor PIC chip 111, enabling the waveguides $16a_1$ to $16a_n$ and $16b_1$ to $16b_n$ to be defined in either the photonic chip (e.g. SOI) material or the gain medium material (e.g. InP). During fabrication, the pit 14 may be etched from the device layer down to the substrate, followed by epitaxial growth of the gain medium 102 or placement of the gain medium chip 112 within the pit 14. The cladding (oxide) layer may be removed from the PIC chip 111 in order to improve the thermal conductivity between the gain medium 102 and the substrate, and to match the height of the gain medium 102 with the semiconductor device layer. The gain medium 102 or the gain medium chips 112 may be bonded to electrical contacts (metal or doped semiconductor), e.g. control lines $17a_1$ to $17a_n$ and $17b_1$ to $17b_n$ which are connected to metal terminals for connecting with external control and/or power.

The PIC chip 111 may include a separate substrate with a semiconductor, e.g. silicon, device layer formed thereon, which includes the couplers $3_1$ to $3_n$ and all connecting waveguides. Ideally the PIC chip 111 comprises a silicon on insulator (SOI) structure including an upper silicon device layer, a middle silicon dioxide cladding layer, and a bottom silicon substrate. The advantage of this arrangement is that electrical controls on the PIC chip 111 may control the properties of the amplifiers $101_1$ to $101_n$, e.g. wavelength and gain.

Figure 5:
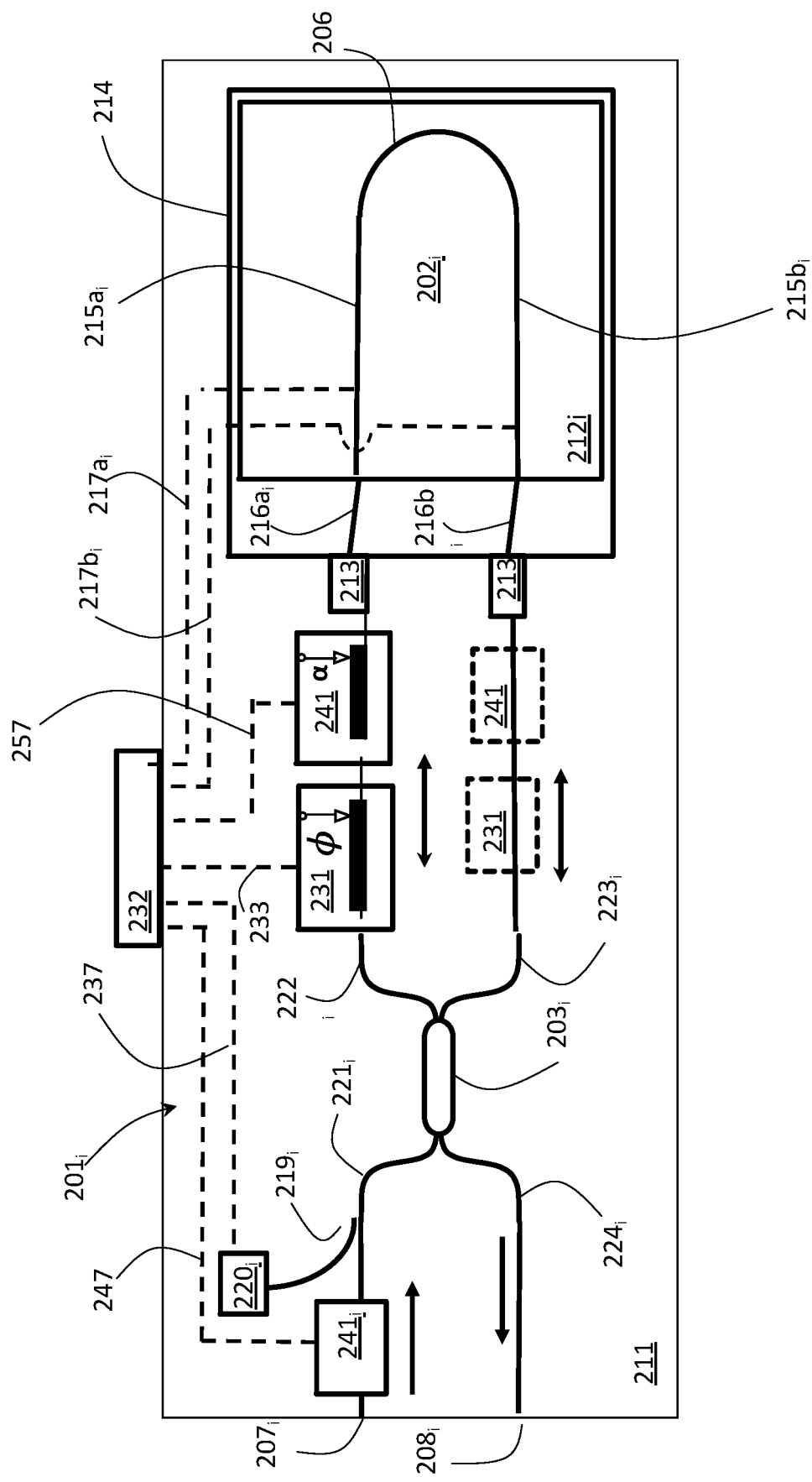
FIG. 5 schematic plan view of an optical amplifier with a U-shaped reflector in accordance with another embodiment of the present invention.

With reference to FIG. 5, an amplifier device of an alternative embodiment of the present invention includes one or more amplifiers $201_i$, each including a gain medium $202_i$, and a coupler $203_i$ (similar to coupler 3). (i being a natural number) Instead of a typical reflector 6, a U-turn 206 is provided in the gain medium $202_i$ for redirecting light back to the coupler $203_i$. An input port $207_i$ and an output port $208_i$ are provided for receiving and transmitting light to and from the amplifier $201_i$ provided on a PIC chip 211.

The gain medium $202_i$ may comprise any suitable amplification material, a suitable group III-V gain material, such as InP, GaAs and GaN based materials, in particular a semiconductor optical amplifier (SOA), which may be based on bulk, quantum well or quantum dot material. The gain medium $202_i$ may be provided on the photonic integrated chip 211, as illustrated in FIGS. 1A, 1B and 5, or the gain medium $202_i$ may be provided on a separate gain chip with the remaining elements, i.e. the coupler $203_i$, provided on the PIC chip 211, as illustrated in FIG. 1C. The gain medium chip $212_i$, e.g. a RSOA, may also be placed, e.g. flip-chip bonded, onto the PIC chip 211, as illustrated in FIGS. 1B and 5, or the gain medium $202_i$ may be grown onto the photonic integrated chip 211 to form the amplifier $201_i$ defined in the device layer formed thereon, as illustrated in FIG. 1A.

The PIC chip 211 may include a separate substrate with a semiconductor, e.g. silicon, device layer formed thereon, which includes the coupler $203_1$ or the couplers $203_1$-$203_n$ and all connecting waveguides. Ideally the PIC chip 211 comprises a silicon on insulator (SOI) structure including an upper silicon device layer, a middle silicon dioxide cladding layer, and a bottom silicon substrate. The advantage of this arrangement is that electrical controls on the PIC chip 211 may control the properties of the amplifier 201, e.g. wavelength.

When the gain medium $202_i$ is embedded within the semiconductor PIC chip 211, as in FIGS. 1A, 1B and 5, the connecting waveguides ($216a_i$ and $216b_i$) may be defined in either the photonic chip, e.g. SOI, material (See FIG. 1A) or the gain medium material, e.g. InP, (See FIG. 1B). During fabrication, a pit 214 may be etched from the device layer down to the substrate, followed by epitaxial growth of the gain medium $202_i$ (FIG. 1A) or placement of the gain medium chip $212_i$ within the pit 214 (FIGS. 1B and 5). The cladding (oxide) layer may be removed from the PIC chip 211 in order to improve the thermal conductivity between the gain medium $202_i$ and the substrate, and to match the height of the gain medium $202_i$ with the semiconductor device layer. The gain medium $202_i$ or the gain medium chip $212_i$ may be bonded to electrical contacts (metal or doped semiconductor), which are connected to metal terminals for connecting with external control and/or power, as hereinafter described.

Each optical coupler $203_i$ may include a first port or branch $221_i$ on one side optically coupled to the input port $207_i$, second and third ports or branches $222_i$ and $223_i$ on an opposite side optically coupled to the gain medium $202_i$, and a fourth port or branch $224_i$ on the one side optically coupled to the output port $208_i$. The first and fourth ports or branches 221 and 224 may be optically coupled to additional optical elements in the device layer of the PIC chip 211 and/or to an edge of the PIC chip 211. The terms optically coupled or coupled are intended to mean connected for the sake of transmitting light therebetween, typically directly connected or utilizing some form of waveguide structure, e.g. integrated waveguides in the device layer, with or without other intermediate optical elements therebetween. The optical coupler $203_i$, e.g. a 2×2 directional coupler (DC), may be connected to the gain medium $202_i$ in order to split an incoming beam of light into two sub-beams, one sub-beam including a first percentage, e.g. 40%-60%, ideally 50%, of the power directed to a first channel $215a_i$ of the gain medium $202_i$, and a second sub-beam including a second percentage, e.g. 40%-60%, ideally, 50% (or −3 dB) directed to the second channel $215b_i$ of the gain medium $202_i$. The coupling ratio may be optimized to trade for coupling losses in the device layer and amplification imbalances in the two waveguide channels 215a and 215b.

One or more I/O waveguides $216a_i$ and $216b_i$, from the gain medium $202_i$ may be angled at a small acute angle to a normal from the output facet of the gain medium $202_i$, e.g.

by 5° to 15°, ideally by 9°, and include an anti-reflection coating to reduce the back reflection at the output facet.

The reflector, in the form of a U-turn waveguide 206 optically coupled to the first and second channels $215_i$ and $216_i$, redirects the first and second sub-beams back through the other side of the gain medium $202_i$ to the other of the second or third ports or branches 222 and $223_i$, i.e. the opposite port from which the sub-beam entered the gain medium $202_i$.

An optical coupler 213, as described above, may be provided for coupling the light between the gain medium $202_i$, in particular from the gain medium chip $212_i$, and the device layer on the PIC chip 211, in particular the coupler $203_i$. Due to the large mode mismatch between the I/O waveguides $216a_i$ and $216b_i$ (or the waveguide channels $215a_i$ and $215b_i$) from the gain medium $202_i$ and the waveguides in the device layer of the PIC chip 211, the optical coupler 213 may comprise an optical spot-size converter (SSC), which may be provided in the device layer of the PIC chip 211 to reduce the coupling loss between the gain medium $202_i$ and the PIC chip 211. Alternatively or in addition, the I/O waveguides $216a_i$ and $216b_i$ may include a tapering width and or height for expanding the mode reentering the gain medium $202_i$ and for contracting the mode leaving the gain medium chip $212_i$.

One of more phase shifters or phase tuning sections 231, as defined above, may be provided in or between the optical coupler $203_i$ and the gain medium $202_i$, coupled to one or both of the second and third ports or branches 222 and 223, as illustrated in FIGS. 1A, 1B and 5. Each phase tuning section 231 may comprise any form of suitable phase tuning device, e.g. thermo-optic, electro-optic etc. The phase tuning section 231 may be controlled by an external controller 232, via control line 233, to control, e.g. the index of refraction or the effective optical length of the waveguide, i.e. the relative phase of the first and second sub-beams, whereby the first and second sub-beams are substantially correctly phased so that when the first and second amplified sub-beams return to the coupler $203_i$, the coupler $203_i$ combines the first and second amplified sub-beams coherently, so that coherent cancellation occurs, and substantially all of the combined amplified output beam is transmitted to the fourth port or branch $224_i$ and subsequently the output port $208_i$, and substantially none of the combined amplified output beam is transmitted back to the first port or branch 221 and subsequently to the input port $207_i$. The phase tuner, i.e. the phase tuning, may be provided by alternative means, e.g. in the coupler $203_i$ or in the gain medium $202_i$ or gain chip $212_i$.

To ensure the amplitude of each of the sub-beams is substantially the same or at a desired level relative to each other when combining in the coupler $203_i$ to minimize back reflection at the input port $207_i$, the controller 232 may also independently adjust or tune the drive current, i.e. the amplification, provided to each channel $215a_i$ and $215b_i$ of the gain medium $202_i$ via control lines $217a_i$ and $217b_i$, respectively. The tuning of the drive current may also act as or act in conjunction with the phase tuner 231.

Alternatively or in addition, a variable optical attenuator (VOA) 241 may be positioned in or between the optical coupler $203_i$ and the gain medium $202_i$, coupled to one or both of the second and third ports or branches $222_i$ and $223_i$. Like the adjustment of the drive current, the VOA may be adjusted by the controller 232 via control lines 257 to ensure the amplitude of each of the sub-beams is substantially the same or at a desired level relative to each other when combining in the first coupler $203_i$ to minimize back reflection at the input port $207_i$.

An optical sensor may be provided between the input port $207_i$ and the coupler $203_i$ for detecting an amount of back reflection from the gain medium $202_i$. The optical sensor may include a monitor tap $219_i$, ideally in the form of a directional coupler, provided on the waveguide between the first port $221_i$ and the input port $207_i$ for separating off a small test portion, e.g. <5%, of the return light and delivering the test portion to a photodetector $220_i$, to provide a measure of back reflection from the amplifier $201_i$. The controller 232 receives the measure of the back reflection via control line 237, and may tune the phase tuner 231 and/or the VOA and/or the drive currents to the channels 215a and 215b to minimize the back reflection at the input port $207_i$, and therefore maximize the output power in the amplified output beam at the output port $208_i$.

An optical filter $241_i$ may be provided, ideally between the input port $207_i$ and the first port or branch $221_1$, for passing one or more selected optical wavelengths in the input optical signal and filtering out unwanted wavelengths, prior to amplification in the gain medium $202_i$. With reference to FIGS. 2A and 2B, the optical filter $241_i$ may comprise an unbalance Mach Zehnder interferometer 41 or a ring resonator 41, as hereinbefore described.

Figure 6:
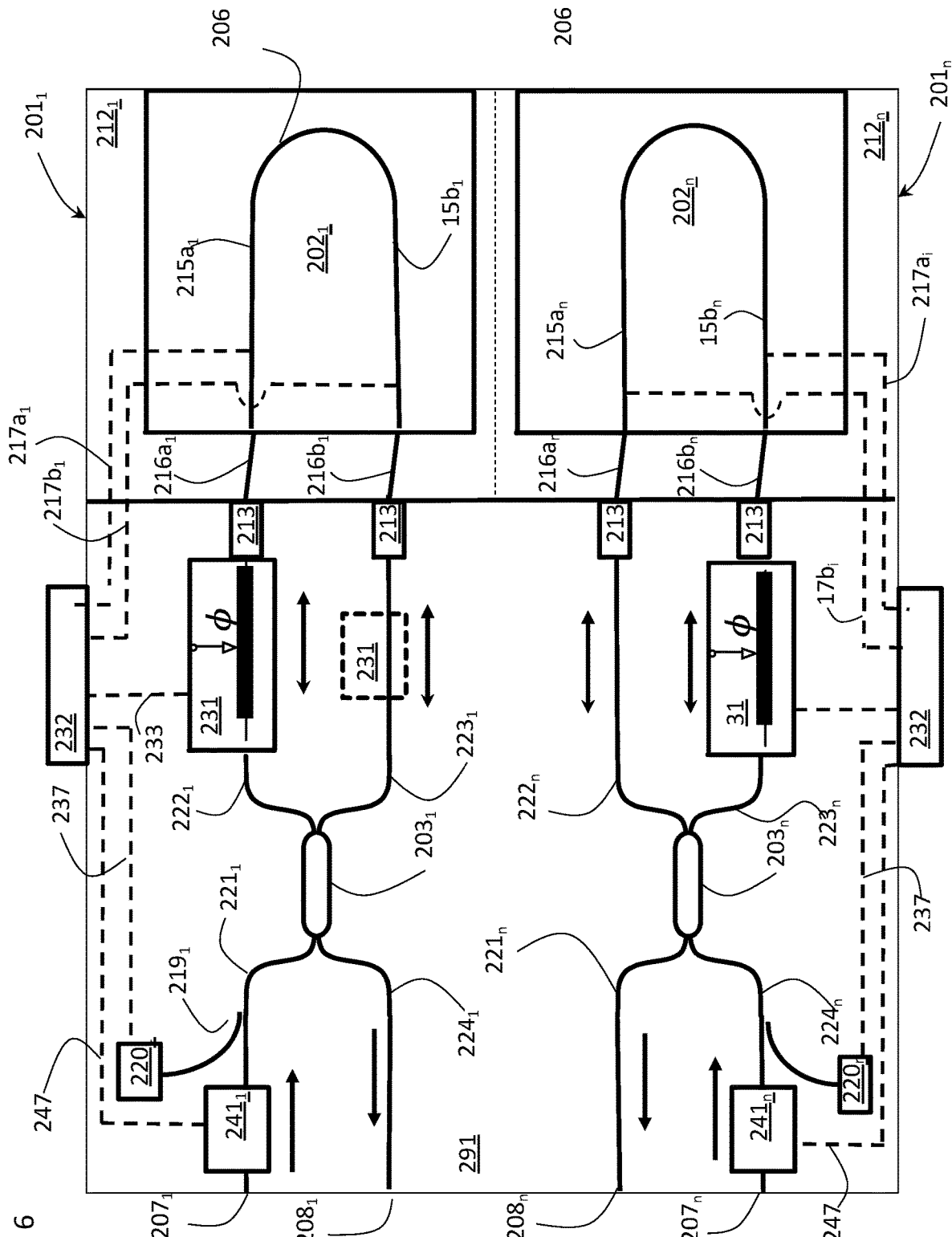
FIG. 6 schematic plan view of an multi-optical amplifier assembly in accordance with another embodiment of the present invention.

In another embodiment, illustrated in FIG. 6 an array of amplifiers $201_1$ to $201_n$ (n equal to a plurality, e.g. 2 or more) are provided on the same PIC chip 291, each amplifier $201_1$ to $201_n$ with a separate gain mediums $202_1$-$202_n$. An array of the elements, e.g. filters 241, phase tuning elements 231 and couplers $203_1$-$203_n$, may be provided on the single PIC chip 291, while a plurality of gain mediums $202_1$ to $202_n$ may be provided, as in hereinbefore described with reference to FIGS. 1A to 1C. For example, an array of separate gain mediums $202_1$-$202_n$, i.e. for amplifying a plurality of different wavelengths, may be provided on a plurality of different gain chips $212_1$-$212_n$, all of which are fixed to the single PIC chip 291. The gain mediums $202_1$-$202_n$ may be the same material capable of amplifying the different wavelengths or the gain mediums $202_1$-$202_n$ may be different materials capable of amplifying the different wavelengths.

Alternatively, a plurality of separate gain mediums $202_1$ to $202_n$ may be grown onto the single PIC chip 291 or a plurality of gain medium chips $212_1$ to $12_n$, e.g. a RSOA, may be placed, e.g. flip-chip bonded, onto the single PIC chip 291 to form the amplifiers $201_1$ to $201_n$ defined in the device layer formed thereon, as hereinbefore defined with reference to FIGS. 1A. 1B and 5, respectively. The gain medium chips $211_1$ to $211_n$ may also be placed into separate pits 214 in the device layer for coupling with additional couplers $203_2$-$203_n$, as described herein. Accordingly, the gain mediums $202_1$ to $202_n$ are embedded within the semiconductor PIC chip 291, enabling the waveguides $216a_i$ to $216a_n$ and $216b_1$ to $216b_n$ to be defined in either the photonic chip, e.g. SOI, material or the gain medium material, e.g. InP. During fabrication, each pit 214 may be etched from the device layer down to the substrate, followed by epitaxial growth of the gain mediums $202_1$ to $202_n$ or placement of the gain medium chips $212_1$ to $212_n$ within the pits 214. The cladding (oxide) layer may be removed from the PIC chip 291 in order to improve the thermal conductivity between the gain mediums $202_1$ to $202_n$ and the substrate, and to match the height of the gain mediums $202_1$ to $202_n$ with the semiconductor device layer. The gain mediums $202_1$ to $202_n$ or the gain medium chips $212_1$ to $212_n$ may be bonded to electrical contacts (metal or doped semiconductor), e.g.

control lines $217a_1$ to $217a_n$ and $217b_1$ to $217b_n$ which are connected to metal terminals for connecting with external control and/or power.

The PIC chip 291 may include a separate substrate with a semiconductor, e.g. silicon, device layer formed thereon, which includes the couplers $203_1$ to $203_n$ and all connecting waveguides. Ideally, the PIC chip 291 comprises a silicon on insulator (SOI) structure including an upper silicon device layer, a middle silicon dioxide cladding layer, and a bottom silicon substrate. The advantage of this arrangement is that electrical controls on the PIC chip 291 may control the properties of the amplifiers $201_1$ to $201_n$, e.g. wavelength and gain.

Alternatively, the array of amplifiers $201_1$ to $201_n$ (n equal to a plurality, e.g. 2 or more) are provided on the same PIC chip 291, each amplifier $201_1$ to $201_n$ with a same gain medium 202, as hereinbefore described with reference to FIG. 4.

Figure 7:
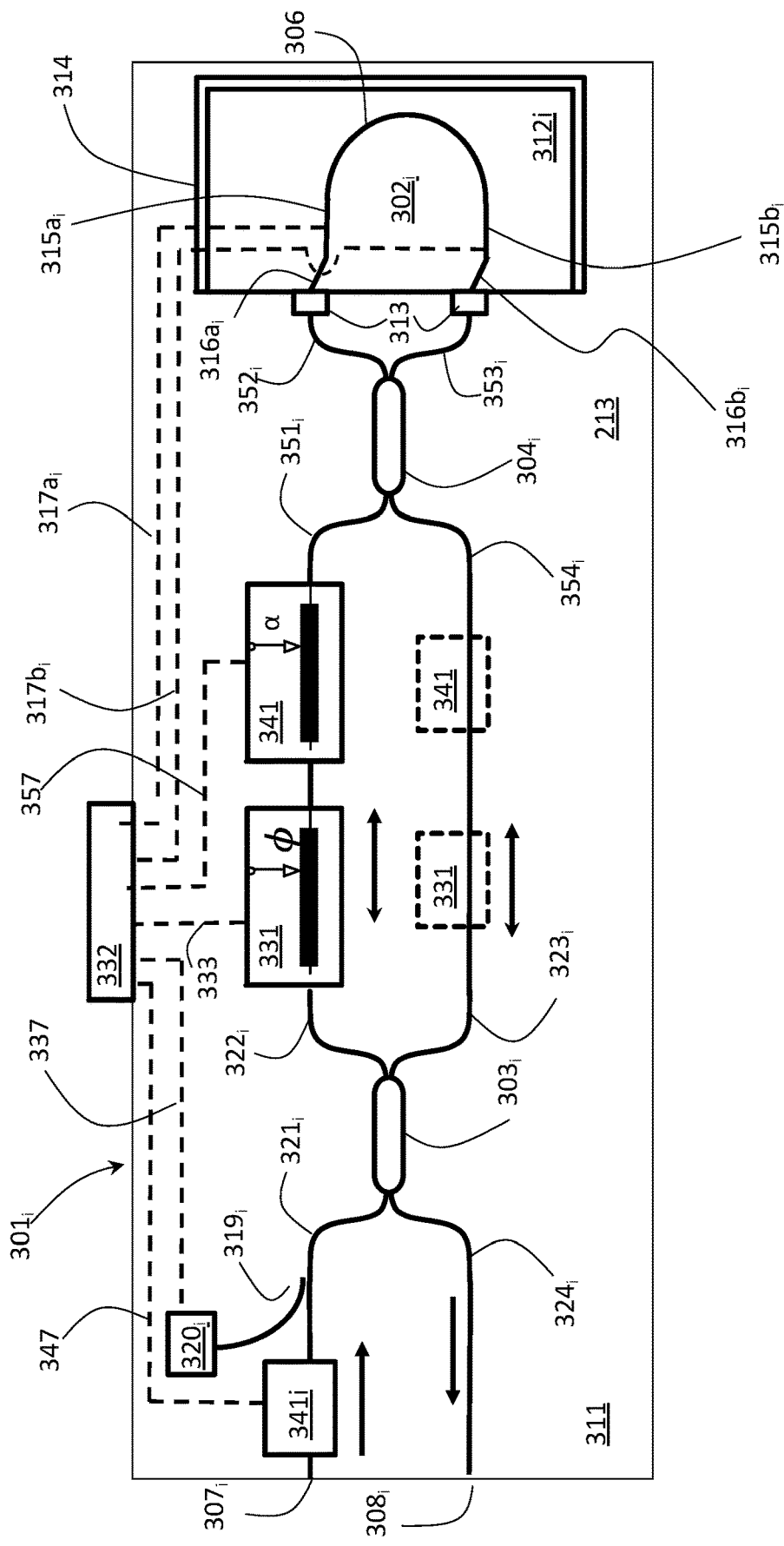
FIG. 7 schematic plan view of an optical amplifier in accordance with another embodiment of the present invention.

With reference to FIG. 7, an amplifier device of an alternative embodiment of the present invention includes one or more amplifiers $301_i$, each including a gain medium $302_i$, a first coupler $303_i$, similar to coupler 3, and a second optical coupler $304_i$. (i being a natural number) Instead of a typical reflector 6, a U-turn 306, including waveguide channels $315a_i$ and $315b_i$, is provided in the gain medium $302_i$ for redirecting light back to the first and second optical couplers $303_i$ and $304_i$. An input port $307_i$ and an output port $308_i$ are provided for receiving and transmitting light to and from the amplifier $301_i$ provided on a PIC chip 311.

The gain medium $302_i$ may comprise any suitable amplification material, e.g. a suitable group III-V gain material, such as InP, GaAs and GaN based materials, in particular a semiconductor optical amplifier (SOA), which may be based on bulk, quantum well or quantum dot material. The gain medium $302_i$ may be provided on the PIC chip 311, as illustrated in FIGS. 1A, 1B and 5, or the gain medium $302_i$ may be provided on a separate gain chip with the remaining elements, i.e. the couplers $303_i$ and $304_i$, provided on the PIC chip 311, as illustrated in FIG. 1C. The gain medium chip $312_i$, e.g. a SOA, may also be placed, e.g. flip-chip bonded, onto the PIC chip 311, as illustrated in FIGS. 1B and 5, or the gain medium $302_i$ may be grown onto the PIC chip 311 to form the amplifier $301_i$ defined in the device layer formed thereon, as illustrated in FIG. 1A.

The PIC chip 311 may include a separate substrate with a semiconductor, e.g. silicon, device layer formed thereon, which includes the couplers $303_1$ and $304_i$ or the couplers $303_1$-$303_n$ and $304_1$-$304_n$ and all connecting waveguides. Ideally the PIC chip 311 comprises a silicon on insulator (SOI) structure including an upper silicon device layer, a middle silicon dioxide cladding layer, and a bottom silicon substrate. The advantage of this arrangement is that electrical controls on the PIC chip 311 may control the properties of the amplifier 301, e.g. wavelength.

When the gain medium $302_i$ is embedded within the semiconductor PIC chip 311, as in FIGS. 1A, 1B and 5, the connecting waveguides $316a_i$ and $316b_i$ may be defined in either the photonic chip, e.g. SOI, material (See FIG. 1A) or the gain medium material, e.g. InP, (See FIG. 1B). During fabrication, a pit 314 may be etched from the device layer down to the substrate, followed by epitaxial growth of the gain medium $302_i$ (FIG. 1A) or placement of the gain medium chip $312_i$ within the pit 314 (FIGS. 1B and 5). The cladding (oxide) layer may be removed from the PIC chip 311 in order to improve the thermal conductivity between the gain medium $302_i$ and the substrate, and to match the height of the gain medium $302_i$ with the semiconductor device layer. The gain medium $302_i$ or the gain medium chip $312_i$ may be bonded to electrical contacts (metal or doped semiconductor), which are connected to metal terminals for connecting with external control and/or power, as hereinafter described.

Each first optical coupler $303_i$ may include a first port or branch $321_i$ on one side optically coupled to the input port $307_i$, second and third ports or branches $322_i$ and $323_i$ on an opposite side optically coupled to the gain medium $302_i$, and a fourth port or branch $324_i$ on the one side optically coupled to the output port $308_i$. The first and fourth ports or branches $321_i$ and $324_i$ may be optically coupled to additional optical elements in the device layer of the PIC chip 311 and/or to an edge of the PIC chip 311. The terms optically coupled or coupled are intended to mean connected for the sake of transmitting light therebetween, typically directly connected or utilizing some form of waveguide structure, e.g. integrated waveguides in the device layer, with or without other intermediate optical elements therebetween. The first optical coupler $303_i$, e.g. a 2×2 directional coupler (DC), may be connected to the gain medium $302_i$ (or the second optical coupler $304_i$) in order to split an incoming beam of light into two sub-beams, one sub-beam including a first percentage, e.g. 40%-60%, ideally 50%, of the power directed to the first channel $315a_i$ of the gain medium $302_i$ (or a first port of the second optical coupler $304_i$), and a second sub-beam including a second percentage, e.g. 40%-60%, ideally, 50% (or −3 dB) directed to the second channel $315b_i$ of the gain medium $302_i$ (or a fourth port of the second optical coupler $304_i$). The coupling ratio may be optimized to trade for coupling losses in the device layer and amplification imbalances in the two waveguide channels $315a$ and $315b$.

If a second optical coupler $304_i$ is provided, each second optical coupler $304_i$ may include a first port or branch $351_i$ on one side optically coupled to the second port $322_i$, second and third ports or branches $352_i$ and $353_i$ on an opposite side optically coupled to the gain medium $302_i$, and a fourth port or branch $354_i$ on the one side optically coupled to the third port $323_i$. The first and fourth ports or branches $351_i$ and $354_i$ may be optically coupled to additional optical elements in the device layer of the PIC chip 311 and/or to an edge of the PIC chip 311. The terms optically coupled or coupled are intended to mean connected for the sake of transmitting light therebetween, typically directly connected or utilizing some form of waveguide structure, e.g. integrated waveguides in the device layer, with or without other intermediate optical elements therebetween. The second optical coupler $304_i$, e.g. a 2×2 directional coupler (DC), may be connected to the gain medium $302_i$ in order to split an incoming beam of light into two sub-beams, one sub-beam including a first percentage, e.g. 40%-60%, ideally 50%, of the power directed to the first channel $315a_i$ of the gain medium $302_i$, and a second sub-beam including a second percentage, e.g. 40%-60%, ideally, 50% (or −3 dB) directed to the second channel $315b_i$ of the gain medium $302_i$. The coupling ratio may be optimized to trade for coupling losses in the device layer and amplification imbalances in the two waveguide channels $315a$ and $315b$. The second optical coupler $304_i$ also mixes and then splits the two returning amplified sub-beams to travel back to the first optical coupler $303_i$, providing individual control of each sub-beam via phase tuners 331 or VOA's 341, as hereinafter described. Accordingly, fine control of the amplification in individual channels $315a_i$ and $315b_i$ of the gain medium $302_i$ is less important, since the two amplified sub-beams are remixed and divided, and then subject to additional on-chip, i.e. PIC chip 311, control by the phase tuners 331 and VOA's 341. In fact all active control of the gain medium $302_i$ may be eliminated, whereby a constant current may be injected into the gain medium $302_i$ during operation, while the control balancing is effected by the second splitter $304_i$, the phase tuner 331 and the VOA 341. A second optical coupler $304_i$ may be provided in any of the aforementioned embodiments, illustrated in FIGS. 1 to 6.

One or more I/O waveguides $316a_i$ and $316b_i$, from the gain medium $302_i$ may be angled at a small acute angle to a normal from the output facet of the gain medium $302_i$, e.g. by 5° to 15°, ideally by 9°, and include an anti-reflection coating to reduce the back reflection at the output facet.

The reflector, in the form of a U-turn waveguide 306 optically coupled to the first and second I/O waveguides $316a_i$ and $316b_i$, redirects the first and second sub-beams back through the other side of the gain medium $302_i$ to the other of the second or third ports or branches 322 and $323_i$, i.e. the opposite port from which the sub-beam entered the gain medium $302_i$.

An optical edge coupler 313, as described above, may be provided for coupling the light between the gain medium $302_i$, in particular from the gain medium chip $312_i$, and the device layer on the PIC chip 311, in particular the second optical coupler $304_i$. Due to the large mode mismatch between the I/O waveguides $316a_i$ and $316b_i$ (or the waveguide channels $315a_i$ and $315b_i$) from the gain medium $302_i$ and the waveguides in the device layer of the PIC chip 311, the optical edge coupler 313 may comprise an optical spot-size converter (SSC), which may be provided in the device layer of the PIC chip 311 to reduce the coupling loss between the gain medium $302_i$ and the PIC chip 311. Alternatively or in addition, the I/O waveguides $316a_i$ and $316b_i$ may include a tapering width and or height for expanding the mode reentering the gain medium $302_i$ and for contracting the mode leaving the gain medium chip $312_i$.

One of more phase shifters or phase tuning sections 331, as defined above, may be provided in or between the first and second optical coupler $303_i$ and $304_i$, coupled to one or both of the second and third ports or branches $322_i$ and $323_i$, as illustrated in FIGS. 1A, 1B and 5, and to one or both of the first and second ports $351_i$ and $354_i$. Each phase tuning section 331 may comprise any form of suitable phase tuning device, e.g. thermo-optic, electro-optic etc. The phase tuning section 331 may be controlled by an external controller 332, via control line 333, to control, e.g. the index of refraction or the effective optical length of the waveguide, i.e. the relative phase of the first and second sub-beams, whereby the first and second sub-beams are substantially correctly phased so that when the first and second amplified sub-beams return to the coupler $303_i$, the coupler $303_i$ combines the first and second amplified sub-beams coherently, so that coherent cancellation occurs, and substantially all of the combined amplified output beam is transmitted to the fourth port or branch $324_i$ and subsequently the output port $308_i$, and substantially none of the combined amplified output beam is transmitted back to the first port or branch 321 and subsequently to the input port $307_i$. The phase tuner, i.e. the phase tuning, may be provided by alternative means, e.g. in the coupler $303_i$ or in the gain medium $302_i$ or gain chip $312_i$.

To ensure the amplitude of each of the sub-beams is substantially the same or at a desired level relative to each other when combining in the first coupler $303_i$ to minimize back reflection at the input port $307_i$, the controller 332 may also independently adjust or tune the drive current, i.e. the amplification, provided to each channel $315a_i$ and $315b_i$ of the gain medium $302_i$ via control lines $317a_i$ and $317b_i$, respectively. The tuning of the drive current may also act as or act in conjunction with the phase tuner 231.

Alternatively or in addition, a variable optical attenuator (VOA) 341 may be positioned in or between the first and second optical couplers $303_i$ and $304_i$, coupled to one or both of the second and third ports or branches $322_i$ and $323_i$, and to one or both of the first and second ports $351_i$ and $354_i$. Like the adjustment of the drive current, the VOA 341 may be adjusted by the controller 332 via control lines 357 to ensure the amplitude of each of the amplified sub-beams returning form the gain chip $312_i$ is substantially the same or at a desired level relative to each other when combining in the first coupler $303_i$ to minimize back reflection at the input port $307_i$.

An optical sensor may be provided between the input port $307_i$ and the first coupler $303_i$ for detecting an amount of back reflection from the gain medium $302_i$. The optical sensor may include a monitor tap $319_i$, ideally in the form of a directional coupler, provided on the waveguide between the first port $321_i$ and the input port $307_i$ for separating off a small test portion, e.g. <5%, of the return light and delivering the test portion to a photodetector $320_i$, to provide a measure of back reflection from the amplifier $301_i$. The controller 332 receives the measure of the back reflection via control line 337, and may tune the phase tuner(s) 331 and/or the drive currents to the channels 315a and 315b and/or the VOA(s) 341 to minimize the back reflection at the input port $307_i$, and therefore maximize the output power in the amplified output beam at the output port $308_i$.

An optical filter $341_i$ may be provided, ideally between the input port $307_i$ and the first port or branch $321_1$, for passing one or more selected optical wavelengths in the input optical signal and filtering out unwanted wavelengths, prior to amplification in the gain medium $302_i$. With reference to FIGS. 2A and 2B, the optical filter $341_i$ may comprise an unbalance Mach Zehnder interferometer 41 or a ring resonator 41, as hereinbefore described.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An optical amplifier device comprising:
   an input port for launching an input optical signal;
   a first coupler including an input optically coupled to the input port, first and second input/outputs, and an output, wherein the first coupler is capable of separating the input optical signal into first and second sub-beams, and outputting the first and second sub-beams via the first and second input/outputs, respectively;
   a gain medium optically coupled to the first and second input/outputs, capable of amplifying the first and second sub-beams forming first and second amplified sub-beams;
   a reflector for reflecting the first and second amplified sub-beams back to the first coupler;
   an output port optically coupled to the output of the first coupler for outputting the amplified optical signal; and
   a first phase shifter capable of adjusting a phase of the first or second amplified sub-beam, so that the first amplified sub-beam combines coherently with the second amplified sub-beam causing coherent cancellation therebetween, and forming a combined amplified optical output signal, whereby substantially all of the combined amplified optical output signal exits the output of the first coupler;

wherein the first coupler is further capable of combining the first and second amplified sub-beams into the combined amplified optical output signal, and outputting the combined amplified optical output signal via the output to the output port.

2. The device according to claim 1, further comprising a controller for independently tuning an amount of gain provided by the gain medium to each of the first and second sub-beams to enhance coherent cancellation between the first and second sub-beams in the first coupler, and reduce back reflection to the input port.

3. The according to claim 2, further comprising an optical sensor optically coupled between the input port and the first coupler for determining an amount of back reflection from the combined amplified optical signal; wherein the controller is capable of tuning the first phase shifter and/or the gain of the gain medium in response to the amount of back reflection.

4. The device according to claim 2, further comprising a second phase shifter capable of adjusting the phase of the second sub-beam and second amplified sub-beam, so that the second amplified sub-beam combines coherently with the first amplified sub-beam, whereby substantially all of the amplified optical output signal exits the output and the output port.

5. The device according to claim 1, further comprising:
a variable optical attenuator (VOA) for attenuating the first or second sub-beam;
a first optical sensor optically coupled between the first input port and the first coupler for determining an amount of back reflection from the first amplified optical signal; and
a controller capable of tuning the first phase shifter and/or the VOA in response to the amount of back reflection.

6. The device according to claim 1, further comprising a first photonic integrated circuit chip for supporting the input port, the first coupler and the output port; and at least a second chip for supporting the gain medium.

7. The device according to claim 1, further comprising a photonic integrated circuit chip for supporting the input port, the first coupler and the output port; wherein the photonic integrated circuit chip includes a pit for receiving at least one gain medium chip.

8. The device according to claim 1, further comprising a band pass filter optically coupled between the input port and the first coupler for passing light in the input optical signal in a selected wavelength range, and rejecting light outside the selected wavelength range.

9. The device according to claim 8, wherein the band pass filter comprises a tunable band pass filter for tuning the selected wavelength range.

10. The device according to claim 1, wherein the reflector comprises a U-turn in the gain medium for redirecting the first sub-beam back through the gain medium to the second input/output and for redirecting the second sub-beam back through the gain medium to the first input/output.

11. The device according to claim 10, further comprising a second coupler between the first coupler and the gain medium for combining and re-separating the first and second sub-beams, and for combining and re-separating the first and second amplified sub-beams.

12. The device according to claim 1, further comprising:
an additional input port for launching an additional input optical signal;
an additional coupler including an additional input optically coupled to the additional input port, additional first and second input/outputs, and an additional output, wherein the additional coupler is capable of separating the additional input optical signal into additional first and second sub-beams, and outputting the additional first and second sub-beams via the additional first and second input/outputs, respectively, to the gain medium, which is also capable of amplifying the additional first and second sub-beams forming additional first and second amplified sub-beams,
wherein the reflector is also capable of reflecting the additional first and second amplified sub-beams back to the additional coupler;
wherein the additional coupler is further capable of combining the additional first and second amplified sub-beams into the additional amplified optical signal, and outputting the additional amplified optical signal via the additional output;
an additional output port optically coupled to the additional output for outputting the additional amplified optical signal; and
an additional first phase shifter capable of adjusting the phase of the additional first sub-beam and the additional first amplified sub-beam, so that the additional first amplified sub-beam combines coherently with the additional second amplified sub-beam causing coherent cancellation therebetween, whereby substantially all of the additional amplified optical signal exits the additional output and the additional output port.

13. The device according to claim 12, further comprising: a first photonic integrated circuit chip for supporting the first and additional couplers; and at least one second chip optically coupled to the first chip for supporting the gain medium.

14. The device according to claim 12, further comprising a first photonic integrated circuit chip for supporting the first and additional couplers; wherein the first photonic integrated chip includes a pit for receiving at least one gain medium chip.

15. The device according to claim 12, further comprising:
a first band pass filter optically coupled between the first input port and the first coupler for passing light in the first input optical signal in a first selected wavelength range, and rejecting light outside the first selected wavelength range; and
an additional band pass filter optically coupled between the additional input port and the additional coupler for passing light in the additional input optical signal in a second selected wavelength range, different from the first selected wavelength range, and rejecting light outside the second selected wavelength range;
wherein the gain medium is capable of amplifying both the first and second selected wavelength ranges.

16. An optical amplifier device comprising:
a first input port for launching a first input optical signal;
a first coupler including first, second, third and fourth branches, the first branch optically coupled to the first input port, wherein the first coupler is capable of separating the first input optical signal into first and second sub-beams onto the second and third branches, respectively;
a gain medium optically coupled to the second and third branches, capable of amplifying the first and second sub-beams forming first and second amplified sub-beams, and a U-turn in the gain medium for redirecting the first sub-beam back through the gain medium to the second branch and for redirecting the second sub-beam back through the gain medium to the first branch; and an output port optically coupled to the fourth branch for outputting an amplified optical output signal; and a first phase shifter capable of adjusting the phase of the first or second amplified sub-beam, so that the first amplified sub-beam combines coherently with the second amplified sub-beam causing coherent cancellation therebetween, whereby substantially all of the amplified optical output signal exits the fourth branch and the output port;

wherein the first coupler is further capable of combining the first and second amplified sub-beams into the amplified optical output signal, and outputting the amplified optical output signal via the fourth branch to the output port.

17. The device according to claim 16, further comprising: a first optical sensor optically coupled between the first input port and the first coupler for determining an amount of back reflection from the amplified optical output signal; and a controller is capable of tuning the first phase shifter and/or the gain of the first gain medium in response to the amount of back reflection.

18. The device according to claim 16, further comprising:
a variable optical attenuator (VOA) for attenuating the first sub-beam and/or the first amplified sub-beam;
a first optical sensor optically coupled between the input port and the first coupler for determining an amount of back reflection from the amplified optical output signal; and
a controller capable of tuning the first phase shifter and/or the VOA in response to the amount of back reflection.

19. The device according to claim 16, further comprising a second coupler between the first coupler and the gain medium for combining and re-separating the first and second sub-beams, and for combining and re-separating the first and second amplified sub-beams.

20. The device according to claim 16, further comprising a band pass filter optically coupled between the input port and the first coupler for passing light in the input optical signal in a selected wavelength range, and rejecting light outside the selected wavelength range.

* * * * *